United States Patent [19]
Gluszek

[11] Patent Number: 6,040,689
[45] Date of Patent: Mar. 21, 2000

[54] CURRENT SENSING METHOD AND APPARATUS

[75] Inventor: Andrew Gluszek, Liverpool, N.Y.

[73] Assignee: SSAC, Inc., Baldwinsville, N.Y.

[21] Appl. No.: 08/877,281

[22] Filed: Jun. 17, 1997

[51] Int. Cl.[7] .................................................. G01R 19/10
[52] U.S. Cl. ....................... 324/127; 324/117 R; 324/102
[58] Field of Search ............................... 324/127, 117 R, 324/132, 140 R, 103 R, 102

[56] References Cited

U.S. PATENT DOCUMENTS

| | | | |
|---|---|---|---|
| 2,210,778 | 8/1940 | Rowell | 324/111 R |
| 3,135,911 | 6/1964 | Van Allen | 323/332 |
| 3,201,688 | 8/1965 | Ferguson | 324/103 R |
| 3,289,079 | 11/1966 | Ferguson | 324/103 R |
| 4,283,678 | 8/1981 | Halter | 324/140 R |
| 4,511,839 | 4/1985 | Bulaty et al. | 324/127 |
| 4,626,777 | 12/1986 | Ainsworth | 324/117 R |
| 4,721,906 | 1/1988 | Ferguson et al. | 324/132 |
| 5,150,039 | 9/1992 | Avocat | 324/127 |
| 5,652,507 | 7/1997 | Blakely | 324/127 |
| 5,689,394 | 11/1997 | Esser | 361/56 |

FOREIGN PATENT DOCUMENTS 56912 2/1969 Poland .

*Primary Examiner*—Josie Ballato
*Assistant Examiner*—Jose M. Solis
*Attorney, Agent, or Firm*—Wall, Marjama, Bilinski & Burr

[57] ABSTRACT

The present invention is a current sensing method and apparatus wherein a current transformer producing a secondary current is disposed in communication with a conductor having a primary current desired to be sensed. A current analyzer in communication with the current transformer is adapted to estimate the primary current in the conductor based on the secondary current output waveform, even in the case where the secondary current is in saturation. In one embodiment, the current analyzer estimates the primary current in the conductor by capturing the secondary current waveform output from the current transformer, selecting a predetermined number of data points in an undistorted, region of the secondary current waveform, and estimating the primary current based on the selected data points.

48 Claims, 4 Drawing Sheets

CURRENT SENSING METHOD AND APPARATUS

BACKGROUND OF THE INVENTION

1. Field of the Invention

The invention relates generally to a method and apparatus for sensing current in a conductor, and particularly to a method and apparatus for sensing current in a current conductor using a small, low cost current transformer.

2. Background of the Prior Art

Costs of sensing current in a conductor typically increase with increasing conductor size. Existing current sensing apparatuses typically include a current transformer that is sized according to the current expected to be seen in the conductor. Current sensors for sensing current in high current conductors, therefore, often include large expensive current transformers having a secondary current output waveform that is representative of the primary current.

Some recent attempts have been made to sense current in a conductor using small sized current transformers which are adapted to sense the primary current of the main conductor despite operating in saturation. In the current sensing apparatus described in U.S. Pat. No. 4,511,839, a circuit is adapted to provide an estimation of primary current based in part on the zero crossing point of the output waveform. Because many current transformers exhibit significant distortion in the zero crossing region, this method often results in an erroneous detection of a zero crossing, and therefore an inaccurate estimation of the primary current.

There exists a need for low cost current sensing apparatus which is adapted to accurately sense current in a conductor.

SUMMARY OF THE INVENTION

According to its major aspects and broadly stated the present invention is a method and apparatus for measuring the current in a conductor utilizing a small inexpensive current transformer. The current sensor is adapted to sense currents above a level at which the current transformer operates in saturation.

In the present invention, a current transformer producing a secondary current is disposed in communication with a conductor having a primary current desired to be sensed. A current analyzer in communication with the current transformer is adapted to estimate the primary current in the conductor based on the secondary current output waveform, even in the case where the secondary current is in saturation.

In one embodiment, the current analyzing apparatus estimates the primary current in the conductor by capturing the secondary current waveform output from the current transformer, selecting a predetermined number of data points in an undistorted region of the secondary current waveform, and estimating the primary current based on the selected data points.

The inventor found that the zero crossing region of secondary current waveform is commonly characterized by significant distortion, when current transformer operates in saturation. Accordingly, in the present invention, selecting data points in an undistorted region of the secondary current waveform normally involves selecting data points in a region of the output waveform away from the zero crossing point. Distortion of the secondary output also occurs, of course, at the point of saturation in the case of a current transformer operating in saturation. Because the saturation point is the maximum current point when the transformer operates in saturation, the step of selecting data points in the present invention also normally involves selecting a point in the output waveform away from a maximum current, or saturation point.

In one particular embodiment of the invention, characteristics of the primary current are estimated by determining the point of maximum current of the secondary output, and then selecting two data points in an undistorted region of the output waveform on the basis of the maximum current. A first data point of the output waveform is selected to be a point where the current is a first predetermined percentage of the maximum current; and a second data point is selected to be a point where the current is a second predetermined percentage of the maximum current, the second predetermined percentage being higher than the first.

Various characteristics of the primary current, including maximum current value, RMS, and average current value can be determined based on a relationship dependent, in part on the time between the first and second data points, and the maximum secondary current value.

These and other details, advantages and benefits of the present invention will become apparent from the detailed description of the preferred embodiment hereinbelow.

BRIEF DESCRIPTION OF THE DRAWINGS

The preferred embodiment of the invention will now be described, by way of example only, with reference to the accompanying Figures wherein like members bear like reference numerals and wherein.

DETAILED DESCRIPTION OF THE PREFERRED EMBODIMENT

Figure 1:
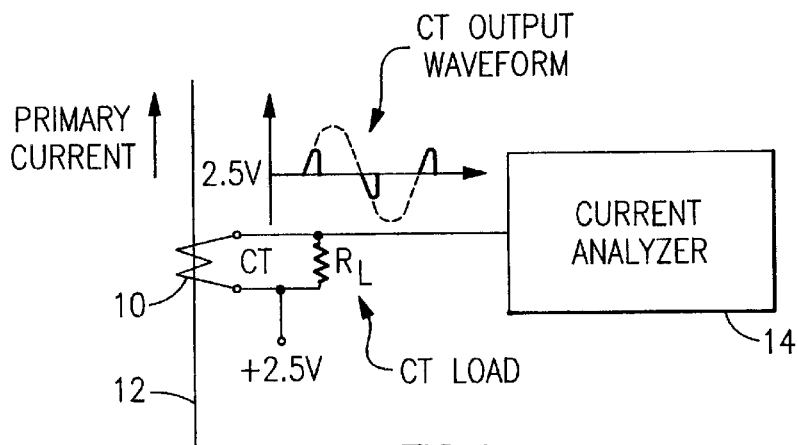
FIG. 1 is a block diagram of an exemplary current sensor according to the invention.

An exemplary embodiment of the invention is shown in FIG. 1. In the present invention, a current transformer 10 producing a secondary current is disposed in communication with a conductor 12 whose current is desired to be sensed. A current analyzing circuit block 14 in communication with the current transformer is adapted to estimate the primary current in the conductor based on the secondary current output waveform, even in the case where the secondary current is in saturation.

In one embodiment, the current analyzing block 14 estimates the primary current in the conductor by capturing the secondary current waveform output from the current transformer 10, identifying a predetermined number of data points in an undistorted region of the secondary current waveform, and estimating the primary current based on the selected data points.

Figure 2:
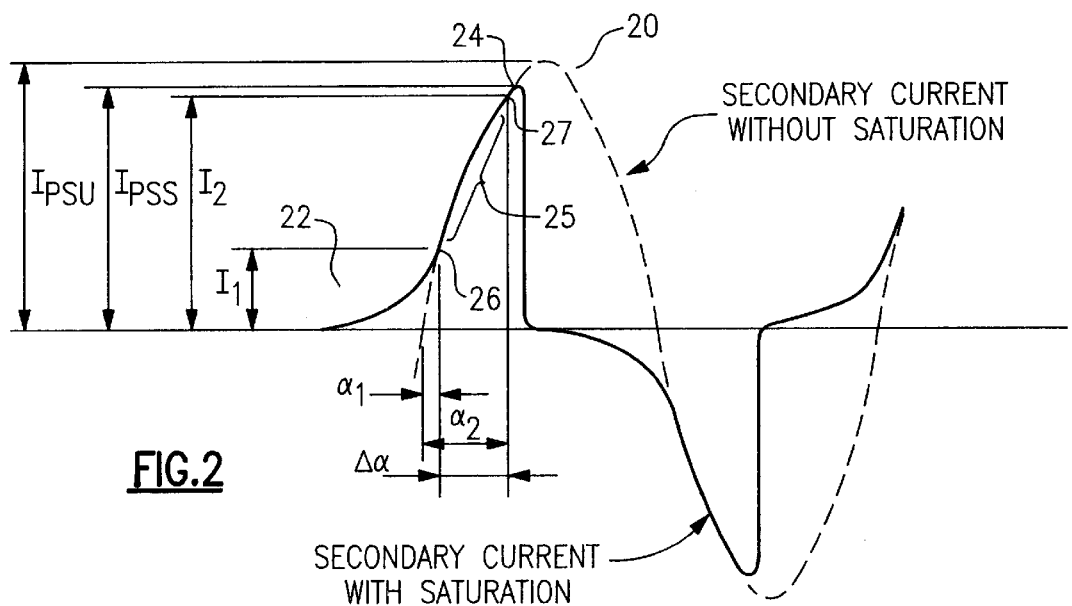
FIG. 2 is an exemplary output waveform of a secondary current of a current transformer operating in saturation.
Figure 4:
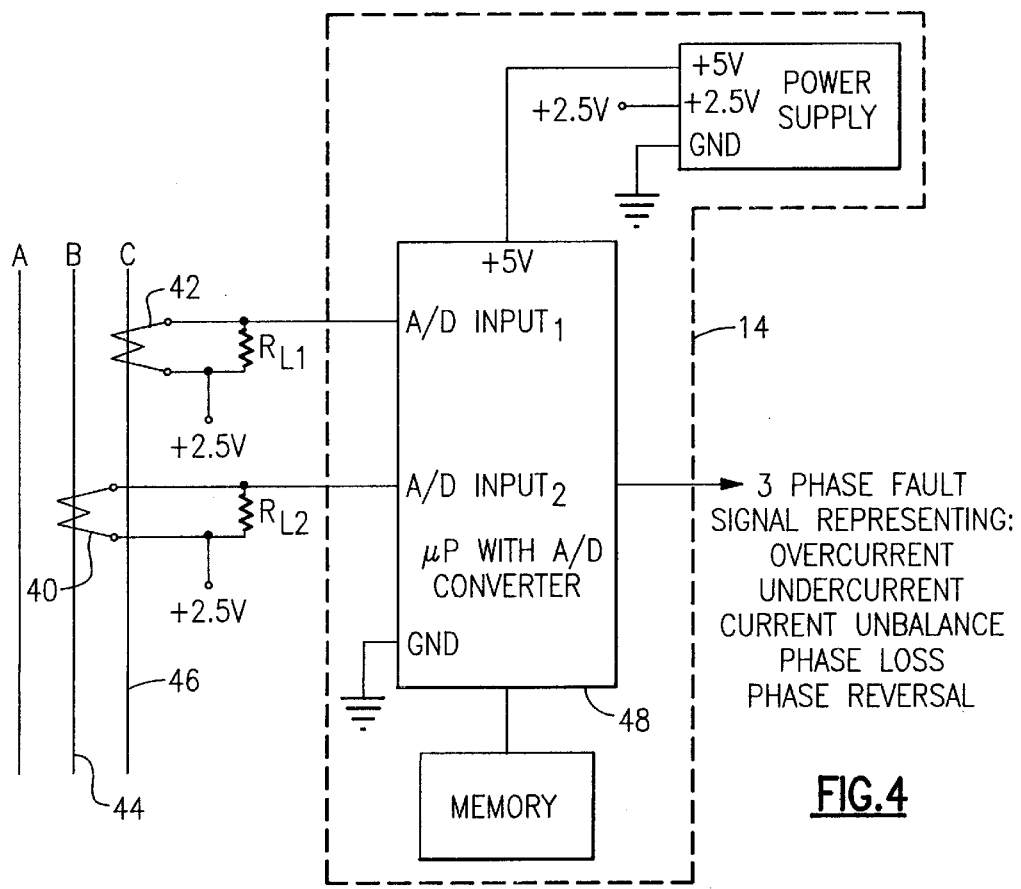
FIG. 4 is a block diagram of a current sensing apparatus according to the invention adapted for sensing current in a three phase conductor.

FIG. 2 shows an exemplary output waveform 20 of a current transformer that operates in saturation. The inventor found that the zero crossing region 22 of secondary current waveform is commonly characterized by significant distortion. This distortion is most significant in the case of a low degree of saturation. The amount of distortion is also influenced by the type of material forming the core of the current transformer. Transformers comprising inexpensive materials having high maximum flux density tend to have higher distortion at the zero crossing. While distortion exists in the zero-crossing region, it is seen that a section 25 of the output waveform closely follows an output waveform. Because distortion is assumed to be significant in the area surrounding the zero crossing region, selecting data points in an undistorted region of the secondary current normally involves selecting data points in a region of the output waveform away from the zero crossing point.

In a further aspect of the invention, it is known that the secondary current is distorted beyond the saturation point 24 in the case of a current transformer operating in saturation. Because the saturation point, IPSS is the maximum current when a transformer operates in saturation, the step of selecting data points normally involves selecting a data point of the output waveform previous to the maximum current point.

In one particular embodiment of the invention, characteristics of the primary current are estimated by determining the point of maximum current of the secondary output, and then selecting at least two data points in an undistorted region of the output waveform on the basis of the maximum current values. A first data point 26 of the output waveform is selected to be a point where the current is a first predetermined percentage of the maximum current; and a second data point 27 of the output waveform is selected to be a point where the current is a second predetermined percentage of the maximum current, the second predetermined percentage being higher than the first. Accordingly, the first data point is selected so that is beyond the zero crossing region, a region characterized by distortion, while the second data point is selected so that it is previous to the region of saturation, also known to be distorted. The first data point may be selected to be, typically, between about 10% and 50% of maximum while the second data point may be selected to be typically between about 80% and about 90% of maximum. The percentage-values used in selecting the first data point is chosen depending on the amount of expected zero-crossing distortion.

Figure 3:
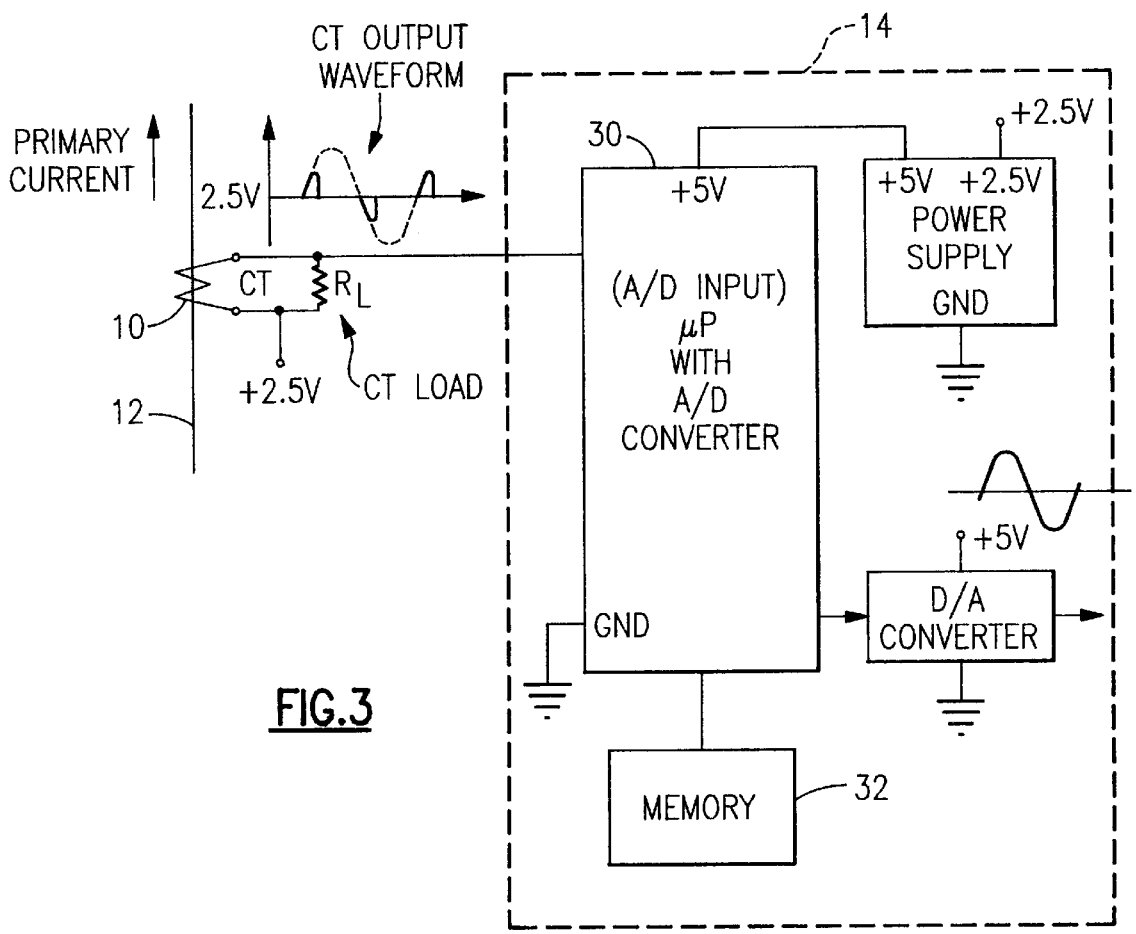
FIG. 3 is a block diagram of a current sensor according to the invention wherein a current analyzer is provided by a microprocessor system.

As shown in FIG. 3 the current analyzing block 14 which determines characteristics of the primary current may be conveniently implemented in a conventional microprocessor system which includes typically a processor 30 an analog-to-digital converter which may be of the built-in type shown, and a memory space 32 typically including a read-only program memory device and a read-write memory device in communication with the processor.

In this implementation, current analyzing block 14 can be programmed to capture a sequence of sampled time and current magnitude data points representing an input waveform. The observed peak current (which is the saturation point in the case of a current transformer operating in saturation) can be determined by a simple and well known program operand such as a compare function. Once the observed peak current is determined, the required magnitudes of the first and second data points, in the specific method described are determined based on the appropriate required percentages of the observed peak current. The time data points corresponding to these first and second data points are then read from memory 32, and used for estimating characteristics of the primary current.

Characteristics of primary current can then be estimated by the first and second data points based on known mathematical relationships relating the first and second data points, and the maximum secondary current to the primary current.

The primary current can always be estimated based on data points selected according to the above method. However, an aspect of the preferred embodiment is that the primary current is not estimated on the basis of selected data points unless the secondary current is in saturation. If the secondary current is not in saturation, then selection of data points to estimate the primary current is unnecessary and the primary current can be determined on the basis of the unsaturated secondary current. A determination that the secondary current is in saturation can be made on the basis of whether the observed peak current is above a specified maximum unsaturated current for the current transformer. The transformer is in saturation when the observed peak current exceeds the specified maximum current for the transformer.

A mathematical formula for estimating an RMS of a primary current by solving for the system of equations $$I_{PSU} = \frac{I_2}{SIN\alpha_1} \quad (1)$$

$$I_{PSU} = \frac{I_2}{SIN\alpha_2} \quad (2)$$

$$\Delta\alpha = \alpha_2 - \alpha_1 \quad (3)$$

where $I_{PSU}$ is the peak secondary current without saturation; $\alpha_1$ is the radian data point corresponding to $I_1$, the first boundary, $\alpha_2$ is the radian data point corresponding to $I_2$, the second boundary point; and $\Delta\alpha$ is the difference, in radians, between $\alpha_2$ and $\alpha_1$, which are calculated according to the formula T=1/f from the time data points stored in memory corresponding to $I_1$ and $I_2$. Solving for the system of equations in terms of $I_{PSU}$ and $\Delta\alpha$ it is found that $$I_{PSU} = \frac{\sqrt{(I_2 - I_1 \cdot cos\Delta\alpha)^2 + I_1^2 \cdot SIN^2\Delta\alpha}}{SIN\Delta\alpha} \quad (4)$$

where $I_{PSU}$ is an estimation of what the peak value of the secondary current would have been if the transformer were not operating in saturation.
Because $$I_{RMS_{SECONDARY}} = \frac{I_{PSU}}{\sqrt{2}} \quad (5)$$

then $$I_{RMS_{SECONDARY}} = \frac{\sqrt{(I_2 - I_1 \cdot cos\Delta\alpha)^2 + I_1^2 \cdot SIN^2\Delta\alpha}}{\sqrt{2} \cdot SIN\Delta\alpha} \quad (6)$$

Further $$I_{AVG_{SECONDARY}} = I_{PSU} \times 0.637 \quad (7)$$

Multiplying by the turns ratio, n, the maximum current, RMS value, and average current value of the primary current can be calculating by solving the equations $$I_{PEAK_{PRIM}} = I_{PSU} \cdot n \quad (9)$$

$$I_{RMS_{PRIM}} = I_{RMS_{SECONDARY}} \cdot n \quad (10)$$

$$I_{AVG_{PRIM}} = I_{AVG_{SECONDARY}} \cdot n \quad (11)$$

Characteristics of the primary current can also be determined by an alternative method wherein candidate sinewaves stored in memory 32 are successively read from memory and compared with the data points, $I_1, T_1$ and $I_2, T_2$. A best one sinewave is selected from the group of candidate sinewaves based on which sinewave best fits the data points. RMS, average current, and maximum current values are then selected based on the selected sinewave. It will be seen that the accuracy of either the mathematical formula estimation method or best fit estimation methods may be enhanced by considering additional data points intermediate the first and second data points.

In addition to solving for discrete number characteristics of the primary current analyzing block 14 can be made to output, on a video monitor or other display or output device, a waveform approximating the waveform output of the primary current. In the case of a primary current estimation method based on selecting a best fit sinewave, this feature may be implemented simply by displaying the selected sinewave, scaled by a factor based on the turns ratio of the current transformer. In the case of an estimation method based on determining an estimation of $I_{PSU}$, the would-be peak secondary current if not for s saturation, then an output waveform corresponding to the primary current can be output by an output device by plotting data points of the output waveform according to the formula $$I = I_{PSU} \cdot \text{SIN } \alpha$$

The data points $I_1, T_1$ and $I_2, T_2$ can be selected by methods other than as percentage values of the maximum secondary current. For example, the magnitude of $I_1$ and $I_2$ can be selected as predetermined current values based on is expected secondary current values.

The first data point selected so as to be subsequent to zero crossing region can also be selected as the point at which the secondary current has less than a predetermined deviation from a sinewave. Similarly, a second data point defining a region of saturation can be selected as a point before or at a point at which the secondary current has more than a predetermined deviation from a sinewave.

The current sensing apparatus can easily be adapted for sensing current components of a three phase conductor.

In an apparatus for sensing three phase current, current transformers 40 and 42 which may operate in saturation, are disposed to sense current in conductor B 44 and conductor C 46 respectively. The output from these conductors, in turn, are input into microprocessor 48. In the case where transformers 40 and 42 operate in saturation, the primary current of each transformer is estimated according to one of the methods described hereinabove. Since it is known that the sum of the currents in conductors A, B, and C will equal zero, the primary current of the third conductor, A, is determined based on the estimated primary current of conductors B and C. Current analyzer 14 in this embodiment can be made to output indicia of such characteristics of three phase current as overcurrent, undercurrent, current unbalance, phase loss, or phase reversal.

Figure 5A:
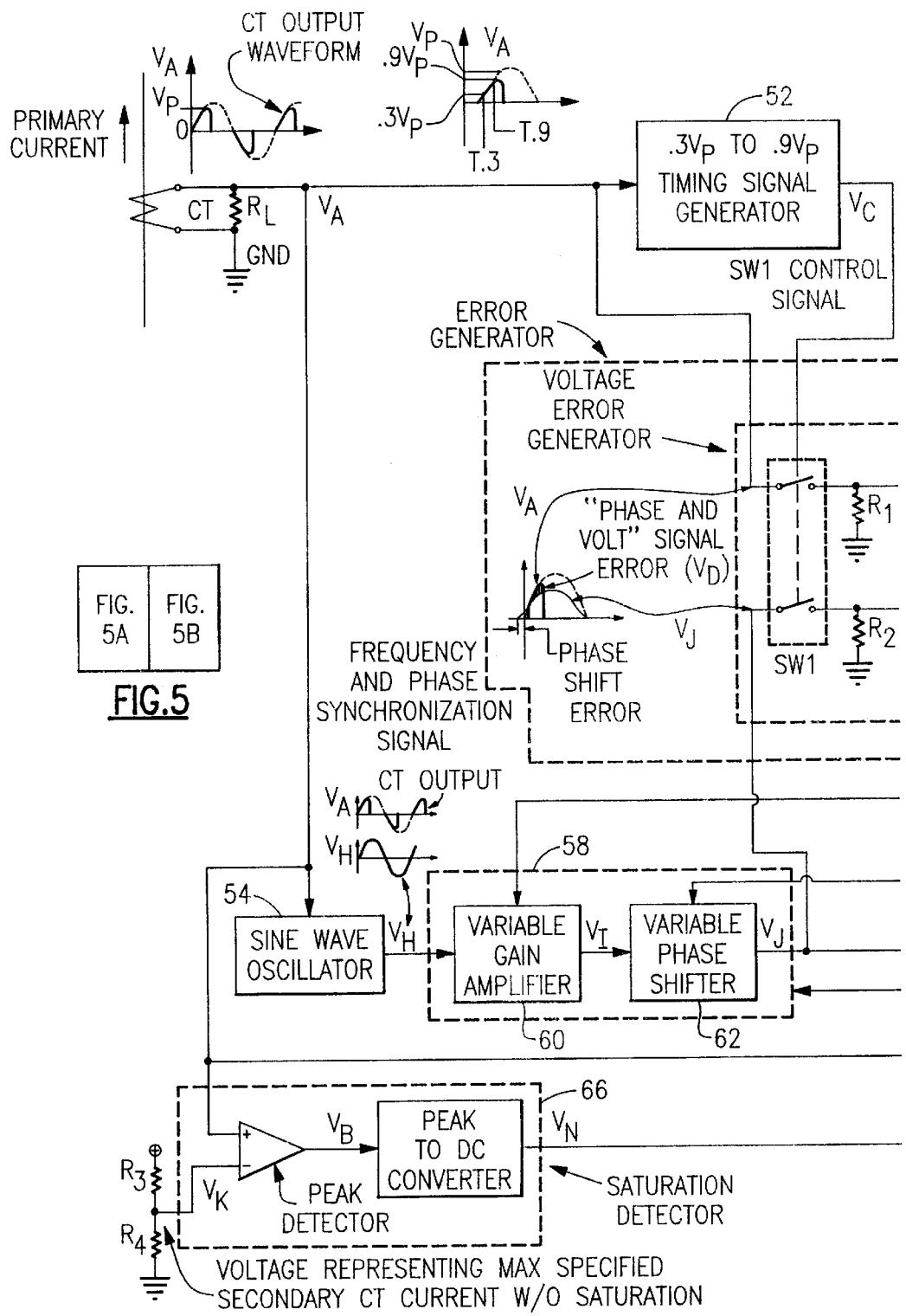
FIG. 5 is a block diagram illustrating a possible embodiment of the invention having a non-microprocessor based current analyzer.
Figure 5B:
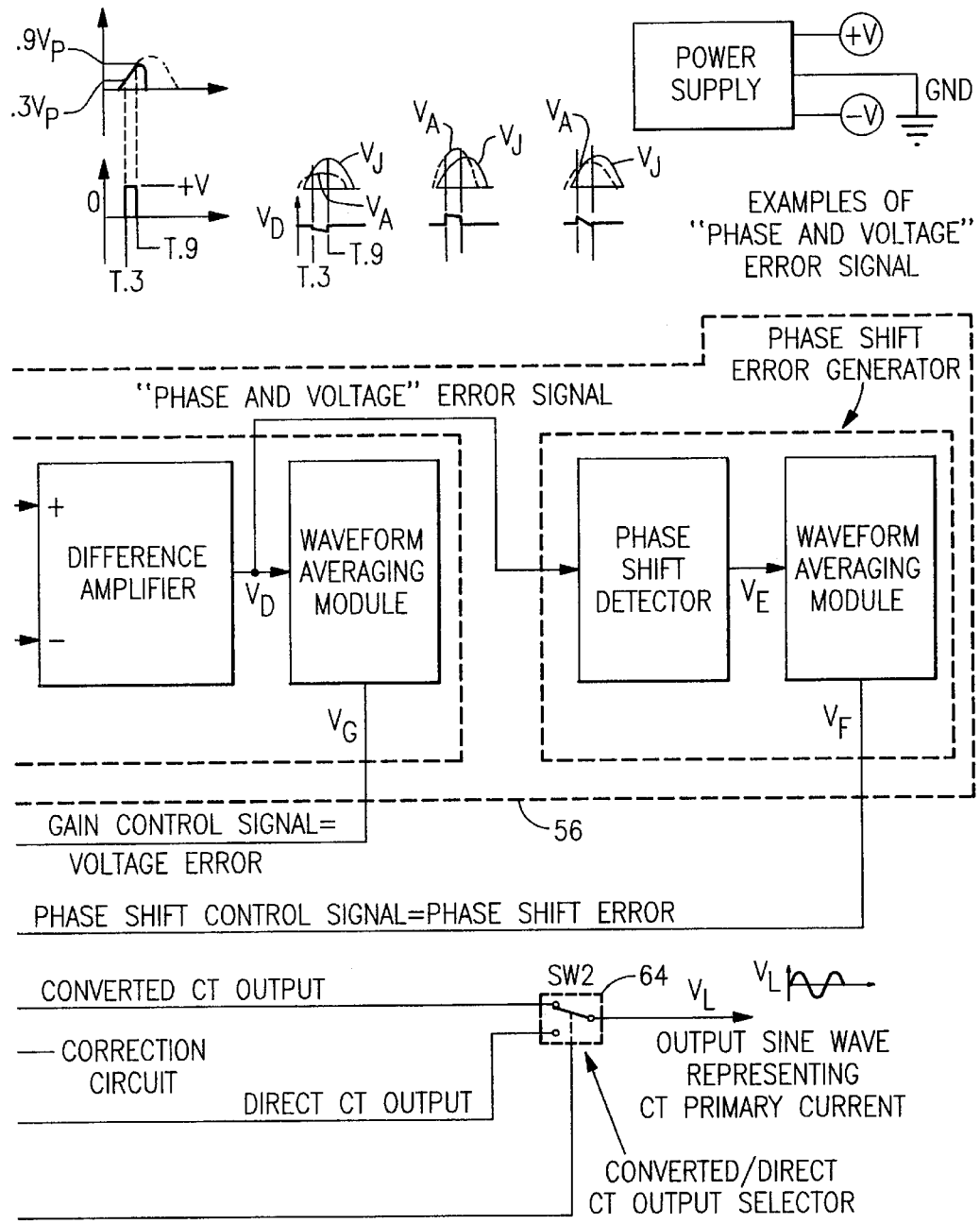

Shown in FIG. 3 as being provided by a system including a microprocessor, current analyzer 14 could be implemented in analog circuitry, digital circuitry or hybrid analog and digital circuitry. One example of a non-microprocessor based embodiment of the invention is shown in FIG. 5. In the embodiment of FIG. 5, current analyzer 14 includes a timing signal generator 52, a sinewave oscillator 54 and an error generator block 56. Timing generator 52 generates timing signals so as to capture a portion of transformer output waveform which is not distorted. The undistorted portion of the output waveform is then compared at error generating block 56 to an output of a correction circuit 58 comprising a variable gain amplifier 60 and variable phase shifter 62. Error generating block 56 generates error signals for causing the outputs of variable gain amplifier 60 and variable phase shifter 62 to bias the output of sinewave oscillator 54 so that the output of correction circuit approaches a sinewave that matches the undistorted portion of the transformer output waveform. Switch 64 which is responsive to the output of saturation detector 66 can be provided for switching the output of the current analyzer between the output of correction circuit 58 and the direct current transformer output.

It will be recognized that the specific microprocessor based and closed loop correction circuit current analyzers described herein have an unlimited number of equivalent circuits which can be designed by ordinarily skilled circuit designers. For example, current analyzer 14 could take a form similar to memory-stored sinewave design as described in U.S. Pat. No. 4,511,839 or may apply another primary current estimating method.

At a high degree of saturation (e.g. during short circuit current), only a small portion of the sinewave is used. An undistorted region of such a sinewave is approximately a straight line. By finding $\Delta V/\Delta T$ or average $dV/dT$ (sampling a predetermined number of points of an undistorted region of the waveform) the primary current can be estimated. Fast acting analog circuits comprising analog or digital differentiators can be provided for estimating primary current, useful especially in detecting short circuit currents.

While this invention has been described in detail with reference to a preferred embodiment, it should be appreciated that the present invention is not limited to that precise embodiment. Rather, in view of the present disclosure which describes the best mode for practicing the invention, many modifications and variations would present themselves to those skilled in the art without departing from the scope and spirit of this invention, as defined in the following claims.

What is claimed is:

1. A current sensing apparatus for sensing current in a conductor, said apparatus comprising:
   a current transformer disposed in electrical communication with said conductor, said current transformer having a secondary current output waveform;
   a current analyzing means in communication with said current transformer, said current analyzing means including
   selecting means for selecting at least two data points in an undistorted region of said secondary current output waveform, wherein said selecting means selects a point at which said secondary current reaches a predetermined deviation from a sinewave as one of said data points; and
   estimating means for estimating characteristics of said conductor current based on said selected data points.

2. The apparatus of claim 1, wherein said estimating means includes calculating means for calculating characteristics of said conductor current using a mathematical formula expressing conductor current in terms of said selected data points.

3. The apparatus of claim 1, wherein said estimating means includes comparing means for comparing candidate sinewaves to said selected data points, and choosing means for choosing a best fit sinewave from said candidate sinewaves, and determining means for determining characteristics of said conductor current based on said chosen sinewave.

4. The apparatus of claim 1, wherein said current analyzing means is provided by a microprocessor system comprising a processor in communication with a memory space and data input conversion means.

5. The apparatus of claim 1, wherein said current analyzing means comprises an error generator and a correction circuit.

6. The apparatus of claim 1, wherein said current analyzing means comprises an error generator and correction circuit, and wherein said error generator comprises a voltage error generator and a phase shift error generator.

7. The apparatus of claim 1, wherein said current analyzing means comprises an error generator and a correction circuit, and wherein said correction circuit comprises a gain amplifier and a phase shifter.

8. The apparatus of claim 1, further comprising:
   detecting means for detecting whether said output waveform is in saturation; and
   switching means for switching an output of said apparatus between said current transformer and said current analyzing means.

9. A current sensing apparatus for sensing current in a conductor, said apparatus comprising:
   a current transformer disposed in electrical communication with said conductor, said current transformer having a secondary current output waveform;
   a current analyzing means in communication with said current transformer, said current analyzing means including
      selecting means for selecting at least two data points in an undistorted region of said secondary current output waveform, wherein said selecting means selects a point at which said secondary current reaches a first predetermined magnitude as one of said data points; and
      estimating means for estimating characteristics of said conductor current based on said selected data points.

10. The apparatus of claim 9, wherein said estimating means includes calculating means for calculating characteristics of said conductor current using a mathematical formula expressing conductor current in terms of said selected data points.

11. The apparatus of claim 9, wherein said estimating means includes comparing me for comparing candidate sinewaves to said selected data points, and choosing means for choosing a best fit sinewave from said candidate sinewaves, and determining means for determining characteristics of said conductor current based on said chosen sinewave.

12. The apparatus of claim 9, wherein said current analyzing means is provided by a microprocessor system comprising a processor in communication with a memory space and data input conversion means.

13. The apparatus of claim 5, wherein said current analyzing means comprises an error generator and a correction circuit.

14. The apparatus of claim 9, wherein said current analyzing means comprises an error generator and correction circuit, and wherein said error generator comprises a voltage error generator and a phase shift error generator.

15. The apparatus of claim 9, wherein said current analyzing means comprises an error generator and a correction circuit, and wherein said correction circuit comprises a gain amplifier and a phase shifter.

16. The apparatus of claim 9, further comprising:
   detecting means for detecting whether said output waveform is in saturation; and
   switching means for switching an output of said apparatus between said current transformer and said current analyzing means.

17. A current sensing apparatus for sensing current in a conductor, said apparatus comprising:
   a current transformer disposed in electrical communication with said conductor, said current transformer having a secondary current output waveform;
   a current analyzing means in communication with said current transformer, said current analyzing means including
      selecting means for selecting at least two data points in an undistorted region of said secondary current output waveform, wherein said selecting means determines a peak saturated secondary current and selects a point at which said secondary current reaches a predetermined percentage of said determined saturated secondary current as one of said data points; and
      estimating means for estimating characteristics of said conductor current based on said selected data points.

18. The apparatus of claim 17, wherein said estimating means includes calculating means for calculating characteristics of said conductor current using a mathematical formula expressing conductor current in terms of said selected data points.

19. The apparatus of claim 17, wherein said estimating means includes comparing means for comparing candidate sinewaves to said selected data points, and choosing means for choosing a best fit sinewave from said candidate sinewaves, and determining means for determining characteristics of said conductor current based on said chosen sinewave.

20. The apparatus of claim 17, wherein said current analyzing means is provided by a microprocessor system comprising a processor in communication with a memory space and data input conversion means.

21. A current sensing apparatus for sensing current in a conductor, said apparatus comprising:
   a current transformer disposed in electrical communication with said conductor, said current transformer having a secondary current output waveform;
   a current analyzer in communication with said current transformer, said current analyzer including
      selecting circuitry for selecting at least two data points in an undistorted region of said secondary current output waveform, wherein said selecting circuitry determines a peak saturated secondary current and selects a point at which said secondary current reaches a predetermined percentage of said determined saturated secondary current as one of said data points; and
      estimating circuitry for estimating characteristics of said conductor current based on said selected data points.

22. The apparatus of claim 21, wherein said estimating circuitry includes calculating circuitry for calculating characteristics of said conductor current using a mathematical formula expressing conductor current in terms of said selected data points.

23. The apparatus of claim 21, wherein said estimating circuitry includes comparing circuitry for comparing candidate sinewaves to said selected data points, and choosing circuitry for choosing a best fit sinewave from said candidate sinewaves, and determining circuitry for determining characteristics of said conductor current based on said chosen sinewave.

24. The apparatus of claim 21, wherein said current analyzer is provided by a microprocessor system comprising a processor in communication with a memory space and data input conversion circuitry.

25. The apparatus of claim 21, wherein said current analyzer comprises an error generator and a correction circuit.

26. The apparatus of claim 21, wherein said current analyzer comprises an error generator and correction circuit, and wherein said error generator comprises a voltage error generator and a phase shift error generator.

27. The apparatus of claim 21, wherein said current analyzer comprises an error generator and a correction circuit, and wherein said correction circuit comprises a gain amplifier and a phase shifter.

28. The apparatus of claim 21, further comprising:
detecting circuitry for detecting whether said output waveform is in saturation; and
switching circuitry for switching an output of said apparatus between said current transformer and said current analyzer.

29. A current sensing apparatus for sensing current in a conductor, said apparatus comprising:
a current transformer disposed in electrical communication with said conductor, said current transformer having a secondary current output waveform;
a current analyzer in communication with said current transformer, said current analyzer including
selecting circuitry for selecting at least two data points in an undistorted region of said secondary current output waveform, wherein said selecting circuitry selects a point at which said secondary current reaches a first predetermined magnitude as one of said data points; and
estimating circuitry for estimating characteristics of said conductor current based on said selected data points.

30. The apparatus of claim 29, wherein said estimating circuitry includes calculating circuitry for calculating characteristics of said conductor current using a mathematical formula expressing conductor current in terms of said selected data points.

31. The apparatus of claim 29, wherein said estimating circuitry includes comparing circuitry for comparing candidate sinewaves to said selected data points, and choosing circuitry for choosing a best fit sinewave from said candidate sinewaves, and determining circuitry for determining characteristics of said conductor current based on said chosen sinewave.

32. The apparatus of claim 29, wherein said current analyzer is provided by a microprocessor system comprising a processor in communication with a memory space and data input conversion circuitry.

33. The apparatus of claim 29, wherein said current analyzer comprises an error generator and a correction circuit.

34. The apparatus of claim 29, wherein said current analyzer comprises an error generator and correction circuit, and wherein said error generator comprises a voltage error generator and a phase shift error generator.

35. The apparatus of claim 29, wherein said current analyzer comprises an error generator and a correction circuit, and wherein said correction circuit comprises a gain amplifier and a phase shifter.

36. The apparatus of claim 29, further comprising:
detecting circuitry for detecting whether said output waveform is in saturation; and
switching circuitry for switching an output of said apparatus between said current transformer and said current analyzer.

37. A current sensing apparatus for sensing current in a conductor, said apparatus comprising:
a current transformer disposed in electrical communication with said conductor, said current transformer having a secondary current output waveform;
a current analyzer in communication with said current transformer, said current analyzer including
selecting circuitry for selecting at least two data points in an undistorted region of said secondary current output waveform, wherein said selecting circuitry selects a point at which said secondary current reaches a predetermined deviation from a sinewave as one of said data points; and
estimating circuitry for estimating characteristics of said conductor current current based on said selected data points.

38. The apparatus of claim 37, wherein said estimating circuitry includes calculating circuitry for calculating characteristics of said conductor current using a mathematical formula expressing conductor current in terms of said selected data points.

39. The apparatus of claim 37, wherein said estimating circuitry includes comparing circuitry for comparing candidate sinewaves to said selected data points, and choosing circuitry for choosing a best fit sinewave from said candidate sinewaves, and determining circuitry for determining characteristics of said conductor current based on said chosen sinewave.

40. The apparatus of claim 37, wherein said current analyzer is provided by a microprocessor system comprising a processor in communication with a memory space and data input conversion circuitry.

41. The apparatus of claim 37, wherein said current analyzer comprises an error generator and a correction circuit.

42. The apparatus of claim 37, wherein said current analyzer comprises an error generator and correction circuit, and wherein said error generator comprises a voltage error generator and a phase shift error generator.

43. The apparatus of claim 37, wherein said current analyzer comprises an error generator and a correction circuit, and wherein said correction circuit comprises a gain amplifier and a phase shifter.

44. The apparatus of claim 37, further comprising:
detecting circuitry for detecting whether said output waveform is in saturation; and
switching circuitry for switching an output of said apparatus between said current transformer and said current analyzer.

45. The apparatus of claim 17, wherein said current analyzing means comprises an error generator and a correction circuit.

46. The apparatus of claim 17, wherein said current analyzing means comprises an error generator and correction circuit, and wherein said error generator comprises a voltage error generator and a phase shift error generator.

47. The apparatus of claim 17, wherein said current analyzing means comprises an error generator and a correction circuit, and wherein said correction circuit comprises a gain amplifier and a phase shifter.

48. The apparatus of claim 17, further comprising:
detecting means for detecting whether said output waveform is in saturation; and
switching means for switching an output of said apparatus between said current transformer and said current analyzing means.

* * * * *

UNITED STATES PATENT AND TRADEMARK OFFICE
CERTIFICATE OF CORRECTION

PATENT NO. : 6,040,689
DATED : March 21, 2000
INVENTOR(S) : Andrew Gluszek

It is certified that error appears in the above—identified patent and that said Letters Patent is hereby corrected as shown below:

CLAIMS

Column 7, Line 41, after the word comparing please delete "me" and insert --means--.

Signed and Sealed this

Tenth Day of April, 2001

*Attest:*

NICHOLAS P. GODICI

*Attesting Officer*    *Acting Director of the United States Patent and Trademark Office*